(12) United States Patent
Liebhard

(10) Patent No.: US 6,509,637 B1
(45) Date of Patent: Jan. 21, 2003

(54) LOW PROFILE MOUNTING OF THICK INTEGRATED CIRCUIT PACKAGES WITHIN LOW-PROFILE CIRCUIT MODULES

(75) Inventor: Markus Karl Liebhard, Chandler, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 0 days.

(21) Appl. No.: 10/094,731

(22) Filed: Mar. 8, 2002

(51) Int. Cl.[7] .................... H01L 23/02; H01L 23/12
(52) U.S. Cl. .................... 257/678; 257/704; 257/666
(58) Field of Search .................... 257/704, 666, 257/678, 775, 106, 121, 123, 125, 638; 361/737; 235/492

(56) References Cited

U.S. PATENT DOCUMENTS

| | | | |
|---|---|---|---|
| 5,371,943 A | * 12/1994 | Shibata .................... | 257/666 |
| 5,760,469 A | * 6/1998 | Higashiguchi et al. ...... | 257/678 |
| 5,822,190 A | * 10/1998 | Iwasaki .................... | 361/737 |
| 6,310,778 B1 | * 10/2001 | Finn et al. .................. | 361/737 |
| 6,353,265 B1 | * 3/2002 | Michii .................... | 257/777 |
| 6,388,338 B1 | * 5/2002 | Romano et al. ............ | 257/787 |
| 6,268,648 B1 | * 7/2002 | Fukutomi et al. ........... | 257/678 |
| 6,426,880 B1 | * 7/2002 | Chen .................... | 361/773 |

FOREIGN PATENT DOCUMENTS

| | | | |
|---|---|---|---|
| JP | 2-260445 | * 10/1990 | .................. 257/684 |
| JP | 4-98842 | * 3/1992 | .................. 29/741 |
| JP | 5-190739 | * 7/1993 | .................. 257/690 |

* cited by examiner

*Primary Examiner*—Jasmine J B Clark
(74) *Attorney, Agent, or Firm*—Jeffrey D. Moy; A. Mitchell Harris; Weiss, Moy & Harris, P.C.

(57) ABSTRACT

An assembly and method for mounting thick integrated circuit packages within a low-profile circuit module provides a low cost alternative to special integrated circuit packaging requirements. Pre-packaged thin-small-outline-packages (TSOP), thin-plastic-quad-flatpack (TQFP) and other similar surface mount packages may be used within a low-profile circuit module, using the techniques and structures of the present invention. A straight lead package is mounted within a cavity in the circuit module substrate, so that the effective height of the integrated circuit package is reduced. Curved lead packages are used by straightening or sawing the leads before mounting.

20 Claims, 2 Drawing Sheets

LOW PROFILE MOUNTING OF THICK INTEGRATED CIRCUIT PACKAGES WITHIN LOW-PROFILE CIRCUIT MODULES

FIELD OF THE INVENTION

The present invention relates generally to circuit modules, and more specifically, to a method and assembly for mounting thick integrated circuit packages within a thin circuit module.

BACKGROUND OF THE INVENTION

Circuit modules or cards are increasing in use to provide storage and other electronic functions for devices such as digital cameras, personal computing devices and personal digital is assistants (PDAs). New uses for circuit modules include multimedia cards and secure digital cards.

Typically, circuit modules contain multiple integrated circuit devices or "dies". The dies are interconnected using a circuit board substrate, which adds to the thickness of the module. Pre-packaged dies are available for some functions at a lower cost than ball-grid array (BGA) or other mountable die packages, and in the early phases of production, the pre-packaged dies may be the only source of an integrated circuit. Low cost pre-packaged dies are typically available in thin-small-outline packages (TSOP) or thin-quad-flatpack (TQFP) packages, but these packages are still too thick for applications such as secure digital cards, which have total package thickness on the order of 2 mm or less. While the plastic package portion of the integrated circuits are typically on the order of 1.0 mm thick, the leads exit the package at mid-height and have "S-lead" forms that provide thermal and other stress relief and standoff above the mounting surface for air circulation. The designs of the above-described packages are adapted for surface mounting above the substrate and make the package height above the substrate unsuitable for circuit module applications.

In order to accommodate the above-described packages, a thin cover could be used, but would require special manufacturing techniques and could not be manufactured or welded to the substrate or outer housing reliably. Additionally, surface mounting to the thin substrates required in circuit modules causes warping of the substrate.

Very thin versions of the TSOP package (VT-TSOP) are being developed, but are not commonly available and are very expensive. Similarly, very thin land-grid-arrays (VT-LGA) are suitable for use within circuit modules but are expensive and not commonly available.

Therefore, it would be desirable to provide a method and assembly for mounting thick integrated circuit packages within a low-profile circuit module. It would further be desirable to provide a method and assembly for modifying packages having standard "S-lead" interconnects for use within a circuit module.

SUMMARY OF THE INVENTION

An assembly and method for mounting thick integrated circuit packages within a low-profile circuit module permits use of a pre-packaged integrated circuit that would otherwise be too thick for proper incorporation within the circuit module. A straight lead package, which may be a standard "S-lead" package, is mounted within a cavity in the circuit module substrate, so that the effective height of the integrated circuit package is reduced.

The circuit module assembly includes the pre-packaged integrated circuit, a carrier including a cavity within which on the pre-packaged integrated circuit is mounted, multiple external contacts coupled to the pre-packaged integrated circuit on the bottom of the carrier for providing an electrical interface to the integrated circuit, and a cover over the top surface of the carrier.

The present invention is best understood by reference to the following detailed description when read in conjunction with the accompanying drawings.

BRIEF DESCRIPTION OF THE DRAWINGS

Common reference numerals are used throughout the drawings and detailed description to indicate like elements.

DETAILED DESCRIPTION

Figure 1A:
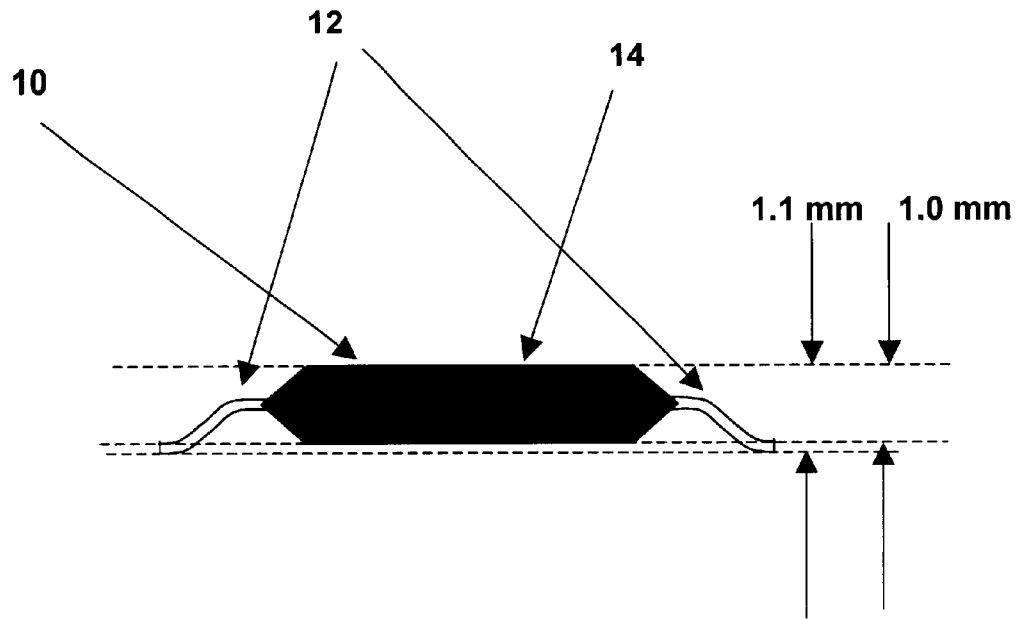
FIG. 1A depicts a prior art integrated circuit package that may be modified for use within an embodiment of the present invention.

Referring to FIG. 1A, a prior art integrated circuit package 10 that may be modified for use within an embodiment of the present invention is depicted. Integrated circuit package 10 is a thin-small-outline (TSOP) package, having s-shaped leads 12 extending from a plastic housing 14 and further extending in a downward direction from plastic housing 14 to provide an electrical surface mountable interface below plastic housing 14. Leads 12, terminate approximately 0.1 mm beneath the bottom of plastic housing 14, to provide a flow area for air cooling and provide for the flow of solvents, etc. during assembly.

The s-shaped leads 12 provide thermal expansion stress relief so that the differential coefficient of expansion between plastic housing 14 and the mounting surface to which integrated circuit package 10 is ultimately attached, does not cause failure of solder bonds between leads 12 and the electrical interface on the mounting surface.

The total thickness of a mounting assembly using integrated circuit package 10 will be the 1.0 mm depicted for the housing circuit package 10 plus the extension of leads 12 below housing 14 which is 0.1 mm. This yields a total height of 1.1 mm above the substrate. Since a mounting substrate for a circuit module will be on the order of 0.5 mm for rigidity and the total thickness of a circuit module for secure digital applications on the order of 2.0 mm, if a top and bottom cover are secured to the assembly, only 0.5 mm is permissible for the total thickness of a top and bottom cover. This leads to covers with a thickness of less than 0.25 mm or less than 10 mils. Covers of this thickness require special manufacturing techniques and are more susceptible to warping and cosmetic defects than thicker covers. Thinner integrated circuit packages are available at higher cost and lead-times for some integrated circuits, but the higher cost and lead times may not be acceptable for commercial applications. Examples of the higher-cost/thinner packages are the very-thin-small-outline-package (VT-TSOP) and very-thin-leaded-grid-array (VT-LGA). Direct die mounting also provides an alternative, such as flip-chip dies or ball-grid-arrays (BGAs), but require cleaner procedures and wire-bonding or other more complex mounting processes.

Figure 1B:
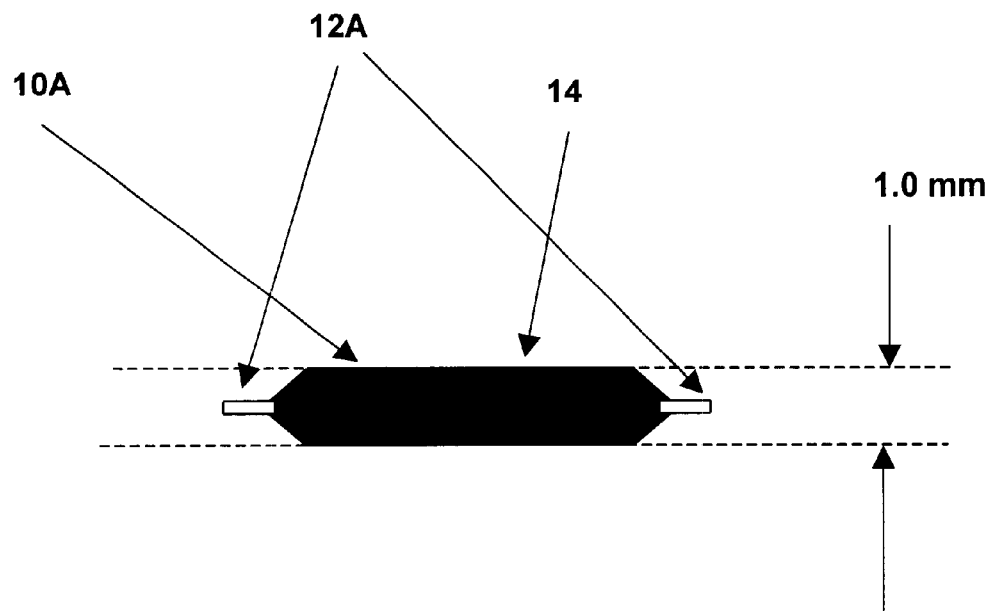
FIG. 1B depicts the integrated circuit package of FIG. 1A as modified for use within an embodiment of the present invention.

Referring now to FIG. 1B, a modified integrated circuit package 10A, adapted for use within a circuit module in accordance with an embodiment of the present invention is depicted. Leads 12A are shortened and confined to a plane substantially near the midpoint of plastic housing 14 by one of a variety of means. Integrated circuit package may be manufactured with modified leads 12A as shown, manufactured without the lead-bending step used to form the s-shaped leads and the leads subsequently cut, if necessary, to the proper length. Alternatively a standard part as depicted by integrated circuit package 10 of FIG. 1A may be purchased and subsequently modified by cutting or bending the leads to the form depicted in FIG. 1B in accordance with the form needed for incorporation in an embodiment of the present invention.

The objective of the present invention is to provide an assembly and method for manufacturing the assembly that permits the use of covers of standard thickness with standard thickness integrated circuits within a circuit module for secure digital and other applications. The objective has been achieved in the circuit module described below. The techniques of the present invention apply similarly to other S-lead packages such as TQFP.

Figure 2A:
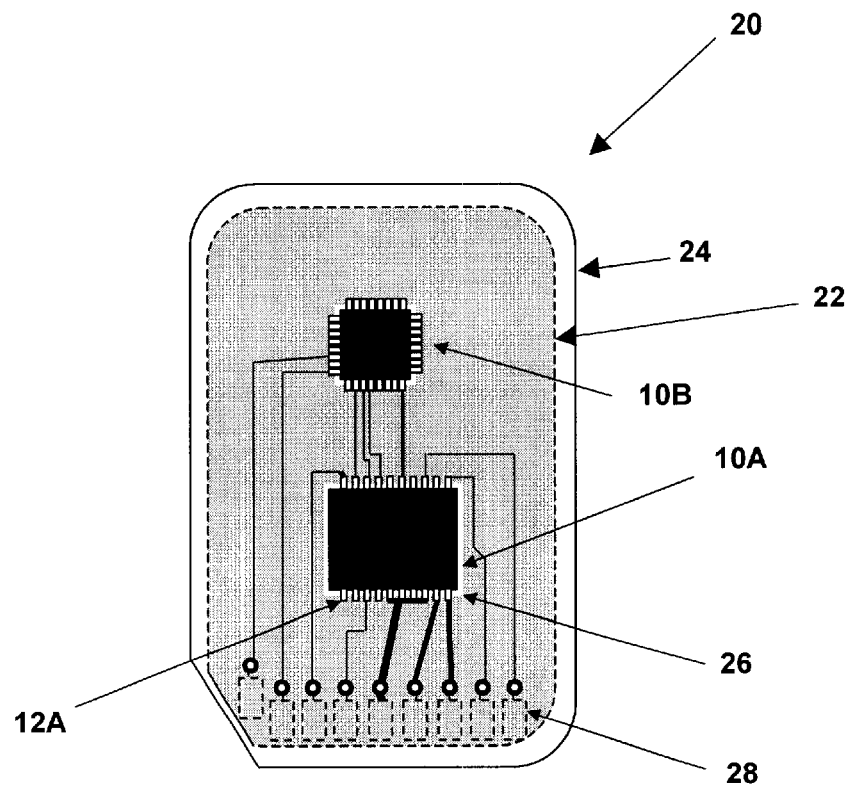
FIG. 2A depicts a top view and FIG. 2B depicts a crosssection of a circuit module in accordance with an embodiment of the present invention.
Figure 2B:
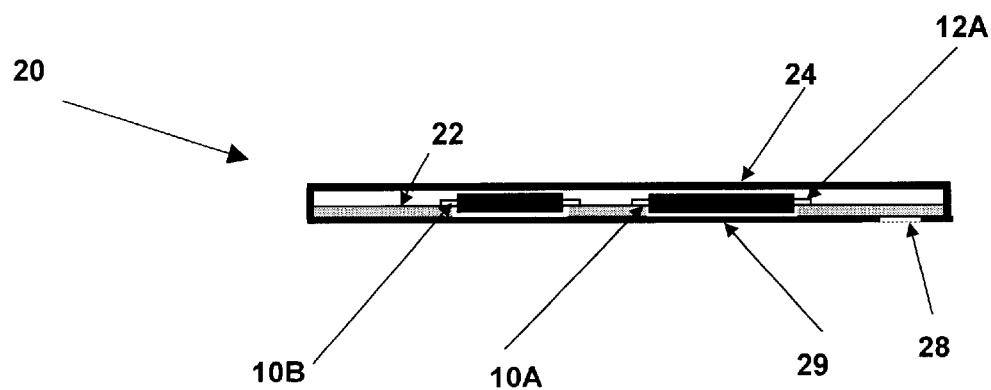

Referring now to FIG. 2A, a top view of a circuit module 20 in accordance with an embodiment of the present invention is depicted. A top cover 24 is transparent in this view to provide a view of components within circuit module 20. A substrate 22 is used to mount integrated circuit packages 10A and 10B.

Integrated circuit packages provide the electronic functionality of circuit module 20 and are interfaced via circuit traces on substrate 22 to electrical contacts 28 on the bottom side of substrate 22. Cavities 26 are cut or otherwise formed in substrate 22 to provide mounting of integrated circuits 10A and 10B within substrate 22, so that the total height of the substrate 22 and integrated circuit mounting is reduced, with the minimum thickness being the thickness of the plastic housing 14 of the thickest integrated circuit incorporated within circuit module 20.

Modified leads 12A are soldered directly to circuit traces on substrate 22, and mechanical integrity is assured due to the short lead length and the use of the present invention within commercial temperature ranges, which are less than the ranges for which the s-lead part of FIG. 1 is designed. Further, since cavities 26 are large with respect to the overall dimensions of substrate 22, thermal expansion or contraction of substrate 22 is minimal.

Referring now to FIG. 2A, a side cross-section view of circuit module 20 is depicted. Integrated circuit packages 10A and 10B can be seen mounted within the substrate 22, rather than on the surface. This reduces the stack height of substrate and integrated circuit packages 10A and 10B, permitting the use of a thicker cover 24 than would be possible with the use of the prior art unmodified integrated circuit package of FIG. 1A. A bottom cover 29 may be used, which may also be made thicker using the techniques of the present invention. Additionally, the top cover 24 may be formed with an encapsulant, or an encapsulant may be applied over substrate 22, before attaching cover 24.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process may be implemented by one of skill in the art in view of this disclosure.

What is claimed is:

1. A circuit module, comprising:
   a pre-packaged integrated circuit for providing an electronic function of the circuit module;
   a carrier defining a cavity for mounting the pre-packaged integrated circuit within the cavity;
   a plurality of external contacts electrically coupled to the integrated circuit and on a bottom of the carrier for providing an electrical interface to the integrated circuit; and
   a cover disposed over a top surface of the carrier to cover the pre-packaged integrated circuit, wherein the thickness measured between a top of the cover and the bottom of the carrier is less than three millimeters thick.

2. The circuit module of claim 1, wherein the pre-packaged integrated circuit is a thin-small-outline package (TSOP) integrated circuit.

3. The circuit module of claim 1, wherein the pre-packaged integrated circuit is a thin-quad-flatpack (TQFP) integrated circuit.

4. The circuit module of claim 1, wherein the pre-packaged integrated circuit is an integrated circuit package with leads extending downward from a plane substantially near a mid-height of the package to below a bottom of the package, and wherein the leads are cut to provide an electrical interface with the carrier substantially near a mid-height of the package.

5. The circuit module of claim 1, wherein the pre-packaged integrated circuit is an integrated circuit packaged with leads extending downward from a plane substantially near a mid-height of the package to below a bottom of the package, and wherein the leads are straightened to provide an electrical interface with the carrier substantially near a mid-height of the package.

6. The circuit module of claim 1, wherein the thickness of the carrier plus the thickness of the pre-packaged integrated circuit plus the thickness of the cover is greater than the thickness of the circuit module.

7. The circuit module of claim 1, further comprising a bottom cover for covering the bottom side of the carrier and wherein the bottom cover defines ports for accessing the plurality of electrical contacts.

8. The circuit module of claim 1, further comprising an encapsulant for covering the pre-packaged integrated circuit, disposed between the cover and the carrier.

9. The circuit module in accordance with claim 1, wherein the prepackaged integrated circuit is an integrated circuit package with leads extending downward from a plane substantially near a mid-height of the package to below a bottom of the package, and wherein the leads are cut to provide an electrical interface with the substrate substantially near a mid-height of the package.

10. The circuit module in accordance with claim 2, wherein the plurality of prepackaged integrated circuits are integrated circuit packages with leads extending downward from a plane substantially near a mid-height of the packages to below a bottom of the packages, and wherein the leads are cut to provide an electrical interface with the substrate substantially near a mid-height of the package.

11. The circuit module of claim 4, wherein the pre-packaged integrated circuit is a thin-small-outline package (TSOP) integrated circuit.

12. The circuit module of claim 4, wherein the pre-packaged integrated circuit is a thin-quad-flatpack (TQFP) integrated circuit.

13. The circuit module of claim 5, wherein the pre-packaged integrated circuit is a thin-small-outline package (TSOP) integrated circuit.

14. The circuit module of claim 5, wherein the pre-packaged integrated circuit is a thin-quad-flatpack (TQFP) integrated circuit.

15. The circuit module of claim 7, wherein the thickness of the carrier plus the thickness of the pre-packaged integrated circuit plus the thickness of the cover plus the thickness of the bottom cover is greater than the thickness of the circuit module.

16. A circuit module, comprising:
   a pre-packaged integrated circuit for providing an electronic function of the circuit module;
   a carrier for mounting the pre-packaged integrated circuit;
   a plurality of external contacts electrically coupled to the integrated circuit and on a bottom of the carrier for providing an electrical interface to the integrated circuit;
   a cover disposed over a top surface of the carrier to cover the pre-packaged integrated circuit, wherein the thickness measured between a top of the cover and the bottom of the carrier is less than three millimeters thick; and
   means for mounting the pre-packaged integrated circuit within the circuit module.

17. The carrier of claim 16, wherein the carrier comprises a plurality of electrical contacts on a bottom of the carrier for providing an electrical interface to the integrated circuit, and adapted for access external to the circuit module.

18. A carrier for mounting a pre-packaged integrated circuit module, wherein the carrier has a thickness of less than one-half of a millimeter and defines a cavity for mounting a pre-packaged integrated circuit.

19. A circuit module, comprising:
   a pre-packaged integrated circuit for providing an electronic function of the circuit module;
   a substrate have a plurality of circuit traces, the substrate having a cavity formed therein, the pre-packaged integrated circuit being mounted within the cavity;
   a plurality of external contacts coupled to the pre-packaged integrated circuit and to the circuit traces for providing an electrical interface to the pre-packaged integrated circuit; and
   a cover disposed over a top surface of the substrate for covering the pre-packaged integrated circuit, wherein a thickness measured between a top surface of the cover and the bottom section of the substrate is less than three millimeters thick.

20. A circuit module in accordance with claim 19 further comprising a plurality of pre-packaged integrated circuits, the substrate having a corresponding and equal number of cavities formed therein for mounting the plurality of pre-packaged integrated circuits on the substrate.

* * * * *